(12) United States Patent
Weisman et al.

(10) Patent No.: US 8,707,145 B2
(45) Date of Patent: Apr. 22, 2014

(54) SYSTEM, METHOD AND APPARATUS FOR TAIL BITING CONVOLUTIONAL CODE DECODING

(75) Inventors: Tzahi Weisman, Mevaseret Tzion (IL); Tom Harel, Shfaim M (IL)

(73) Assignee: Intel Corporation, Santa Clara, CA (US)

( * ) Notice: Subject to any disclaimer, the term of this patent is extended or adjusted under 35 U.S.C. 154(b) by 438 days.

(21) Appl. No.: 13/074,955

(22) Filed: Mar. 29, 2011

(65) Prior Publication Data
US 2012/0250736 A1     Oct. 4, 2012

(51) Int. Cl.
*H03M 13/03*     (2006.01)

(52) U.S. Cl.
USPC ............................ 714/792; 714/795; 714/762

(58) Field of Classification Search
USPC .................. 714/792, 795, 755, 762, 746, 701
See application file for complete search history.

(56) References Cited

U.S. PATENT DOCUMENTS

| | | | |
|---|---|---|---|
| 6,788,750 B1 * | 9/2004 | Reuven et al. ................ 375/341 |
| 7,478,314 B1 | 1/2009 | Cheong et al. | |
| 7,570,700 B2 * | 8/2009 | Cameron et al. ............. 375/265 |
| 8,201,065 B1 * | 6/2012 | Cheong et al. ................ 714/795 |
| 2008/0092025 A1 | 4/2008 | Hedayat et al. | |
| 2008/0104488 A1 | 5/2008 | Cheng | |
| 2010/0095189 A1 | 4/2010 | Park et al. | |

OTHER PUBLICATIONS

International Search Report received for PCT Patent Application No. PCT/US2012/029588, mailed Sep. 27, 2012, 8 pages.

* cited by examiner

*Primary Examiner* — Fritz Alphonse
(74) *Attorney, Agent, or Firm* — Kacvinsky Daisak Bluni PLLC

(57) ABSTRACT

Techniques to decode tail biting convolutional code are disclosed. A plurality of sets for a trellis may be determined. Each set may include a first stage and a second stage of the trellis. Path metrics for each state in a set may be determined when the first stage and the second stage have a same state. The path metrics may be compared to determine a state with a minimum path metric. Bits from the state with the minimum path metric may be output. Other embodiments are described and claimed.

18 Claims, 5 Drawing Sheets

200

Determine a plurality of sets for a trellis of a convolutional code
*202*

Determine path metrics for each state in a set when a first stage and a second stage have a same state
*204*

Compare the path metrics to determine a state with a minimum path metric
*206*

Output bits from the state of the minimum path metric
*208*

*FIG. 2*

SYSTEM, METHOD AND APPARATUS FOR TAIL BITING CONVOLUTIONAL CODE DECODING

BACKGROUND

Convolutional codes are typically used for wireless data transfer. Often convolutional codes are used in applications such as mobile communications, digital video, radio, and satellite communications, among other applications. Digital communication use convolutional codes to encode transmitted information. One type of convolutional code is referred to as a "tail biting" convolutional code. A tail biting convolutional code is a code that begins and ends with the same state.

Various techniques are used to efficiently decode a tail biting convolutional code. A circular Viterbi technique with extra bits, e.g., Viterbi stages, may be used. The extra bits facilitate the convergence of a trellis. A trellis is a diagram or graph that may be used to decode a convolutional code. After a length of the trellis plus the extra bits is determined, a state having a best metric may be identified and used as a starting point for a traceback operation. The traceback operation may output an estimated number of message bits. For instance, in some cases as many as one hundred extra bits or more are used. However, this traditional approach suffers from performance loss and a large overhead leading to relatively poor results for shorter message lengths.

Another technique to decode a tail biting convolutional code may include a wrapped around Viterbi algorithm (WAVA) technique. A WAVA technique processes a tail biting trellis iteratively by exploring an initial state of a transmitted sequence though continuous Viterbi decoding and improving the decoding decision with iterations. Path metrics are used to derive a sufficient condition for the decision to be optimal. While the WAVA algorithm approaches maximum likelihood performance, several iterations matching a length of a trellis are required along with complicated stopping conditions. As a result, a WAVA algorithm is complex and has an inefficient processing time. Accordingly, improved techniques are needed to efficiently and optimally decode convolutional codes, such as a tail biting convolutional code, for example. It is with respect to these and other considerations that the present improvements have been needed.

BRIEF DESCRIPTION OF THE DRAWINGS

FIG. 2 illustrates an embodiment of a logic flow for the system of FIG. 1.

DETAILED DESCRIPTION

Figure 1:
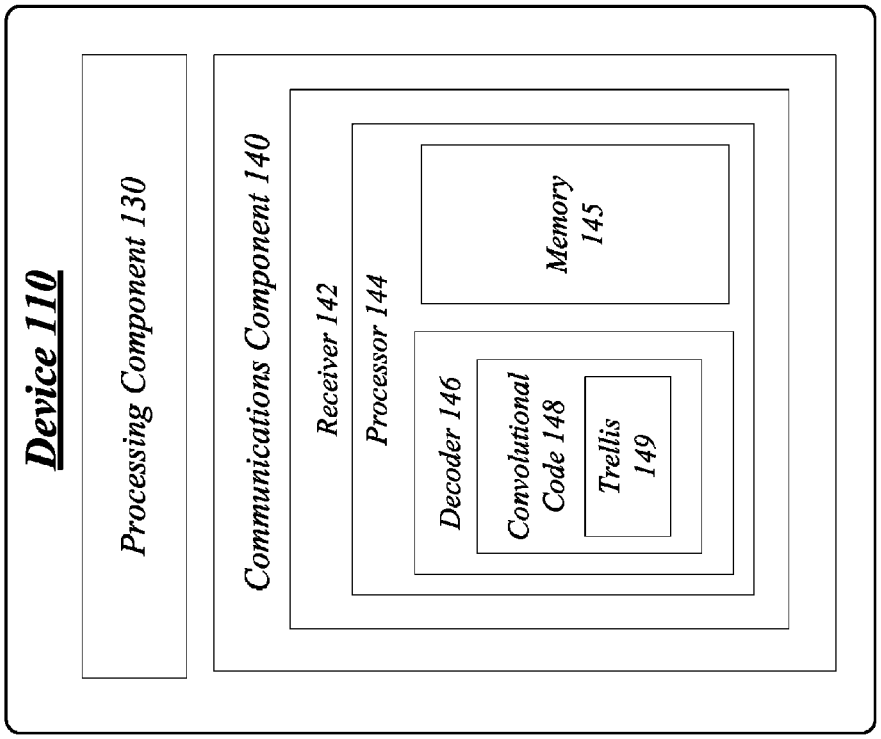
FIG. 1 illustrates an embodiment of a communications system.
Figure 1:
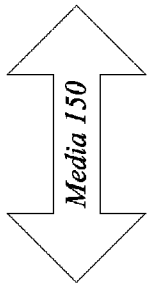

Various embodiments are generally directed to wireless communications systems. Some embodiments are particularly directed to one or more enhanced decoding techniques to decode a convolutional code for a wireless communications system, such as a tail biting convolutional code, among others. Current techniques using the Viterbi algorithm for decoding a convolutional tail biting code often have a relatively large iteration length. The long iteration length hampers actual implementation for larger messages and thus leads to non-optimal algorithms that use an unnecessary number of extra bits. Further, these algorithms suffer from considerable performance loss as well as a large relative overhead when shorter messages are involved.

To solve these and other problems, various embodiments implement enhanced decoding techniques arranged to efficiently decode a tail biting convolutional code. A convolution code may encode a bitstream using forward error correction. In an embodiment, a plurality of sets for a trellis of a convolutional code may be determined. A trellis is a type of diagram used to decode a convolutional code. A trellis may be divided into multiple overlapping sets. In an embodiment, each set may include a first stage and a second stage of the trellis and each set may overlap with at least one other set. Path metrics may be determined for each state in a set when the first stage and the second stage have a same state. Path metrics may be a summary of the branches or path used in the trellis from the first stage to the second stage. The path metrics may be compared to determine a state with a minimum path metric. A minimum path metric may be an optimal path from a first stage to a second stage. Bits may be output from the state with a minimum path metric. In an embodiment, decoding the convolutional code may reach near optimal performance efficiency for a convolutional code with a shorter message length. As a result, embodiments can improve affordability, scalability, modularity, extendibility, or interoperability for an operator, device or network.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives falling within the spirit and scope of the claimed subject matter.

FIG. 1 illustrates a block diagram for a system 100. In one embodiment, the system 100 may comprise a communications system 100. Although the system 100 shown in FIG. 1 has a limited number of elements in a certain topology, it may be appreciated that the system 100 may include more or less elements in alternate topologies as desired for a given implementation.

In various embodiments, the communications system 100 may comprise, or form part of a wired communications system, a wireless communications system, or a combination of both. For example, the communications system 100 may include one or more devices arranged to communicate information over one or more types of wired communication links. Examples of a wired communication link, may include, without limitation, a wire, cable, bus, printed circuit board (PCB), Ethernet connection, peer-to-peer (P2P) connection, backplane, switch fabric, semiconductor material, twisted-pair wire, co-axial cable, fiber optic connection, and so forth. The communications system 100 also may include one or more devices arranged to communicate information over one or more types of wireless communication links, such as wireless shared media 150. Examples of a wireless communication link may include, without limitation, a radio channel, infrared channel, radio-frequency (RF) channel, Wireless Fidelity (WiFi) channel, a portion of the RF spectrum, and/or one or more licensed or license-free frequency bands. In the latter case, the wireless devices may include one more wireless interfaces and/or components for wireless communication, such as one or more transmitters, receivers, transmitter/receivers ("transceivers"), radios, chipsets, amplifiers, filters, control logic, network interface cards (NICs), antennas, antenna arrays, and so forth. Examples of an antenna may include, without limitation, an internal antenna, an omni-directional antenna, a monopole antenna, a dipole antenna, an end fed antenna, a circularly polarized antenna, a micro-strip antenna, a diversity antenna, a dual antenna, an antenna array, and so forth. In one embodiment, certain devices may include antenna arrays of multiple antennas to implement various adaptive antenna techniques and spatial diversity techniques.

The communications system 100 may communicate information in accordance with one or more standards as promulgated by a standards organization. In various embodiments, the communications system 100 may comprise or be implemented as a mobile broadband communications system. Examples of mobile broadband communications systems include, without limitation, systems compliant with various Institute of Electrical and Electronics Engineers (IEEE) standards, such as the IEEE 802.11 standards for Wireless Local Area Networks (WLANs) and variants, the IEEE 802.16 standards for Wireless Metropolitan Area Networks (WMANs) and variants, and the IEEE 802.20 or Mobile Broadband Wireless Access (MBWA) standards and variants, among others. In one embodiment, for example, the communications system 100 may be implemented in accordance with the Worldwide Interoperability for Microwave Access (WiMAX) or WiMAX II standard. WiMAX is a wireless broadband technology based on the IEEE 802.16 standard of which IEEE 802.16-2004 and the 802.16e amendment (802.16e-2005) are Physical (PHY) layer specifications. WiMAX II is an advanced Fourth Generation (4G) system based on the IEEE 802.16j and IEEE 802.16m proposed standards for International Mobile Telecommunications (IMT) Advanced 4G series of standards. The embodiments are not limited in this context.

The communications system 100 may communicate, manage, or process information in accordance with one or more protocols. A protocol may comprise a set of predefined rules or instructions for managing communication among devices. In various embodiments, for example, the communications system 100 may employ one or more protocols such as a beam forming protocol, medium access control (MAC) protocol, Physical Layer Convergence Protocol (PLCP), Simple Network Management Protocol (SNMP), Asynchronous Transfer Mode (ATM) protocol, Frame Relay protocol, Systems Network Architecture (SNA) protocol, Transport Control Protocol (TCP), Internet Protocol (IP), TCP/IP, X.25, Hypertext Transfer Protocol (HTTP), User Datagram Protocol (UDP), a contention-based period (CBP) protocol, a distributed contention-based period (CBP) protocol and so forth. In various embodiments, the communications system 100 also may be arranged to operate in accordance with standards and/or protocols for media processing. The embodiments are not limited in this context.

The communication system 100 may have one or more devices 110, 120. A device 110, 120 generally may comprise any physical or logical entity for communicating information in communications system 100. A device 110, 120 may be implemented as hardware, software, or any combination thereof, as desired for a given set of design parameters or performance constraints. Although FIG. 1 may show a limited number of devices by way of example, it can be appreciated that more or less devices may be employed for a given implementation.

In an embodiment, a device 110, 120 may be a computer-implemented system having one or more software applications and/or components. For example, a device 110, 120 may comprise, or be implemented as, a computer system, a computing device, a computer sub-system, a computer, an appliance, a workstation, a terminal, a server, a personal computer (PC), a laptop, an ultra-laptop, a handheld computer, a personal digital assistant (PDA), a smart phone, a tablet computer, a gaming device, a set top box (STB), a television, a digital television, a telephone, a mobile telephone, a cellular telephone, a handset, a wireless access point, a base station (BS), a subscriber station (SS), a mobile subscriber center (MSC), a radio network controller (RNC), a microprocessor, an integrated circuit such as an application specific integrated circuit (ASIC), a programmable logic device (PLD), a processor such as general purpose processor, a digital signal processor (DSP) and/or a network processor, an interface, an input/output (I/O) device (e.g., keyboard, mouse, display, printer), a router, a hub, a gateway, a bridge, a switch, a circuit, a logic gate, a register, a semiconductor device, a chip, a transistor, or any other device, machine, tool, equipment, component, or combination thereof. The embodiments are not limited in this context.

In an embodiment, a device 110, 120 may comprise, or be implemented as, software, a software module, an application, a program, a subroutine, an instruction set, computing code, words, values, symbols or combination thereof. A device 110, 120 may be implemented according to a predefined computer language, manner or syntax, for instructing a processor to perform a certain function. Examples of a computer language may include C, C++, Java, BASIC, Perl, Matlab, Pascal, Visual BASIC, assembly language, machine code, microcode for a network processor, and so forth. The embodiments are not limited in this context.

A device 110, 120 may execute processing operations or logic for the system 100 using a processing component 130. The processing component 130 may comprise various hardware elements, software elements, or a combination of both. Examples of hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

The device 110 may communicate with other devices, such as, but not limited to, device 120, over a communications media 150 using communications signals via the communications component 140. By way of example, and not limitation, communications media 150 includes wired communications media and wireless communications media. Examples of wired communications media 150 may include a wire, cable, metal leads, printed circuit boards (PCB), backplanes, switch fabrics, semiconductor material, twisted-pair wire, co-axial cable, fiber optics, a propagated signal, and so forth. Examples of wireless communications media may include acoustic, radio-frequency (RF) spectrum, infrared and other wireless media.

The devices 110, 120 of communications system 100 may be arranged to communicate one or more types of information, such as media information and control information. Media information generally may refer to any data representing content meant for a user, such as image information, video information, graphical information, audio information, voice information, textual information, numerical information, alphanumeric symbols, character symbols, and so forth. Control information generally may refer to any data representing commands, instructions or control words meant for an automated system. For example, control information may be used to route media information through a system, or instruct a device to process the media information in a certain manner. The media and control information may be communicated from and to a number of different devices or networks.

The device 110 may execute communications operations or logic using communications component 140. The communications component 140 may implement any well-known communications techniques and protocols, such as techniques suitable for use with packet-switched networks (e.g., public networks such as the Internet, private networks such as an enterprise intranet, and so forth), circuit-switched networks (e.g., the public switched telephone network), or a combination of packet-switched networks and circuit-switched networks (with suitable gateways and translators). The communications component 140 may include various types of standard communication elements, such as one or more communications interfaces, network interfaces, network interface cards (NIC), radios, wireless transmitters/receivers (transceivers), wired and/or wireless communication media, physical connectors, and so forth.

The communications components 140 may comprise, or be implemented as, software, a software module, an application, a program, a subroutine, instructions, an instruction set, computing code, words, values, symbols or combination thereof. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context. When communications component 140 is implemented as software, the software may be executed by any suitable processor and memory unit.

In one embodiment, the communications component 140 may include a receiver 142. A receiver 142 may be arranged to receive voice information and/or data information. In an embodiment, the receiver 142 may receive voice information and/or data information over one or more assigned frequency bands of a wireless communication channel.

A receiver 142 may receive signals from another device via the communications media 150. Signals may be transmitted over communications media 150, such as, but not limited to, Wimax, LTE, CDMA, WiFi, and 3G and 4G technologies. Signals may be encoded or decoded in order to protect the signal from noise resulting from adjacent channel signals. Convolution codes may be used to protect data bits in the signals from noise. A convolution code may encode data bits using forward error correction. By encoding the signals using a convolution code, a signal-to-noise ratio (SNR) may be decreased.

A receiver 142 may include a processor 144. In an embodiment, a processor 144 may be a baseband processor. A receiver 142 may be implemented as a communications component 140 using any suitable processor 144 or logic device, such as a modem processor or baseband processor, for example.

In an embodiment, a processor 144 may include or implement a decoder 146. In an embodiment, a decoder 146 may receive encoded data from a transmitting device, such as the device 120. The device 120 may encode the data to protect information from interference during transmission. The decoder 146 may decode the encoded data or information received by the receiver 142.

In an embodiment, the decoder 146 may include a reconfigurable Add-Compare-Select (ACS) decoder to support multiple types of decoders. In an embodiment, a reconfigurable ACS decoder may support a Viterbi algorithm decoder, a Bahl-Cocke-Jelinek-Raviv (BCJR) decoder and/or a low-density parity-check (LDPC) decoder.

The decoder 146 may be used to decode convolutional code 148. In an embodiment, the receiver 142 may use a decoder 146 to decode convolutional code 148. Convolutional code 148 may be implemented as forward error correcting code incorporated into a received message. As convolutional code protects against noise from communications system 100, the decoder may decrease the SNR.

In an embodiment, the convolutional code 148 may be decoded using a trellis diagram. An example of a trellis diagram is provided in FIG. 4. The decoder 146 may decode convolutional code 148 by determining a plurality of sets for a trellis. In an embodiment, a trellis may be divided into multiple overlapping sets. In an embodiment, each set may include a plurality of stages of the trellis. Each set may have a different beginning stage and ending stage as each set may capture a different part of the trellis. For each state in each set, a path metric may be determined when a state is tail biting. Path metrics may be a summary of the branches or path used in the trellis from a first stage to a second stage. The path metrics may be compared to determine a state with a minimum path metric. Bits from the state of the minimum path metric may be output.

In one embodiment, a processor 144 may include, or have access to, memory 145. Memory 145 may comprise any machine-readable media. Memory 145 may be implemented using any machine-readable or computer-readable media capable of storing data, including both volatile and non-volatile memory. For example, memory 145 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information.

It is worthy to note that some portion or all of memory 145 may be included on the same integrated circuit or die as processor 144, such as in a system-on-a-chip (SoC) implementation. Additionally or alternatively, some portion or all of memory 145 may be disposed on another integrated circuit or other medium, for example a hard disk drive that is external to the integrated circuit of processor 144. The embodiments are not limited in this context.

In an embodiment, a memory 145 may be used to store parts of the convolutional code 148. The convolutional code 148 may be decoded using a trellis 149 diagram. The memory 145 may store the beginning and ending stages of a trellis 149 of the convolutional code 148. In an embodiment, the memory 145 may store path metrics for different states of the trellis 149.

FIG. 2 illustrates one embodiment of a logic flow 200 for decoding a tail biting convolutional code. The logic flow 200 may be representative of some or all of the operations executed by one or more embodiments described herein.

Included herein is a set of flow charts representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

The logic flow 200 may begin with a message received via a receiver. The message may be decoded via a decoder. In the illustrated embodiment shown in FIG. 2, the logic flow 200 may determine a plurality of sets for a trellis of a convolutional code at block 202. A trellis is a diagram which may be used to decode a convolutional code. In an embodiment, a plurality of sets for a trellis of a convolutional code in the message may be determined. Each trellis may include a number of stages. In an embodiment, a set may be a grouping of stages in a trellis. A first set may begin at stage 0 and end at a second stage of the trellis. Each set may begin at a first stage and end at a second stage. Each set may have a different beginning stage and ending stage.

In various embodiments, there may be a plurality of sets for a trellis. In one embodiment, for example, there may be three sets. In one embodiment, for example, three or more sets may be determined. In one embodiment, for example, there may be two sets or four sets. The embodiments are not limited to a specific number of sets for a trellis.

Each set may have the same number of stages. In other words, each set may have the same length. Since each set may include the same number of stages, the path metrics between the sets may be compared. N may be a length of the trellis in a set, where N represents any positive integer. The length of each set may be N. N may be the length a transmitted message received by the decoder 146. In an embodiment, the number of stages N may be 64. In an embodiment, the number of stages N may be 50 or less. In an embodiment, the number of stages N may be 24. In an embodiment, the number of stages N may range from 5 to 100. In an embodiment, any length of convolutional code may be used. In an embodiment, decoding the tail biting convolutional code may have a maximum likelihood performance when the length of the message is short. In an embodiment, the convolutional code may have a maximum likelihood performance when the number of stages N of the decoded trellis is 50 or less. The embodiments are not limited to the examples described.

In an embodiment, each set may overlap with at least one other set. As the sets overlap, each set may begin after a number of stages have passed. In an embodiment, each set may start the same number of stages after a previous set begins. Overlapping sets, as opposed to contiguous sets, may reduce the total number of scanned stages. Overlapping sets may increase the efficiency and the maximum likelihood performance of the decoding.

Figure 3:
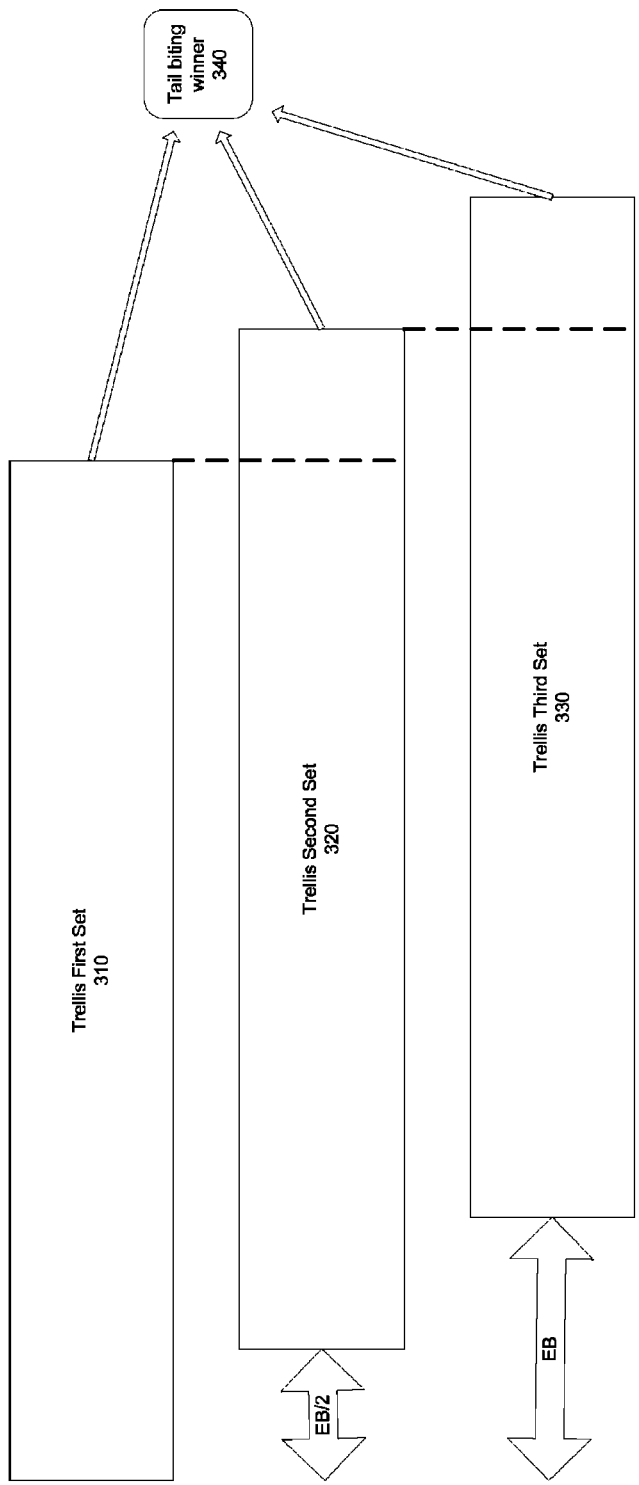
FIG. 3 illustrates an embodiment of a three overlapping sets for an exemplary trellis of tail biting convolutional code.

FIG. 3 illustrates an embodiment of a three overlapping sets for an exemplary trellis 300 of a tail biting convolutional code. As opposed to classical tail biting where path metrics for a trellis are calculated from the beginning to the end, embodiments may calculate path metrics for the trellis using multiple overlapping sets. For example, a trellis 300 may be divided into three sets. A trellis may be length N plus EB, where N is the number of stages in a set and EB are the extra bits. The length of each set may be N. N may be the length a transmitted message received by the decoder 146. The trellis may have N+EB+1 stages.

A first set 310 of the trellis 300 may be determined. A first set may be a zero set as the set may begin at stage 0. A first set may begin or have a first stage at stage 0 and end or have a second stage at stage N, where N is the length of the trellis in a set. From stage 0, the trellis may continue cyclically until EB/2, where EB are the extra bits. EB/2 may be the number of stages that pass since the trellis began. In an embodiment, the extra bits EB for a decoding procedure may be 48. In an embodiment, the extra bits EB for a decoding procedure may be 24. The embodiments are not limited to these examples.

The decoder may determine a second set 320 of the trellis 300. A second set 320 may begin at a first stage and end at a second stage. The second stage of the second set may be N stages from the first stage of the second set. In an embodiment, the first stage of the second set may be located between the first stage of the first set and the second stage of the first set. In an embodiment, the first stage of the second set may begin EB/2 stages after the first stage of the first set. In an embodiment, the second set 320 may have a first stage at stage EB/2 and have a second stage at stage EB/2+N. The first stage of the second set may be located between 0 and N so that the first and second sets overlap.

The decoder may determine a third set 330 of the trellis. The third set may begin at a first stage. The first stage of the third set may be stage EB. The third set may end at a second stage. The second stage of the third set may be stage EB+N. The first stage of the third set may be located between EB/2 and EB/2+N so that the second and third sets overlap.

As shown in FIG. 3, each set may have the same number of stages or length N. Each set may include N+1 trellis stages. In an embodiment, the stages of a trellis may be composed by circular processing. In an embodiment, the sets may be determined in parallel as the sets overlap.

Referring again to FIG. 2, the logic flow 200 may determine path metrics for each state in a set where a first stage and a second stage have a same state at block 204. Path metrics may be a summary of the branches or path used in the trellis 300 from a beginning or first stage to a last or second stage of a set. In an embodiment, a decoder may determine path metrics for each state in a set when a state of a first stage equals a state of a second stage. In an embodiment, the decoder 146 may determine the path metrics sequentially. In an embodiment, at the last or second stage of each set, the convolutional code 148 may determine the state at the beginning or first stage. The state for the last or second stage may be compared with the state at the beginning or first stage. In other words, the decoder 146 may compare the state of the first stage with the stage of the second stage to determine if the states are the same. If the states are the same, then the state is tail biting and the decoder 146 may determine the path metrics for the state.

In an embodiment, the decoder 146 may use an algorithm to determine whether a state of the code is tail biting. In an embodiment, the algorithm may include a RootState_i[s] vector for each set, where s may be the state. The state s may be one of 64 possible states of the convolutional code. In an embodiment, there may be three sets with RootState_i[s], {i=0, 1, 2} vectors. Each vector may hold the state of the corresponding root or first state for the set. A root state may be the state that can be reached by tracing back from a second or last state of the set to the beginning of the set. The RootState_i vectors may be updated for each state s at the following stages:

RootState_0[s] may be updated at stages 0 to N−1.
RootState_1[s] may be updated at states EB/2 to N+EB/2−1.
RootState_2[s] may be updated at stages EB to N+EB−1.

At the end of the associated set, each vector may identify a tail biting state by checking whether RootState_i[s]=s. In an embodiment, two more memory arrays may store the state metrics vector at stages EB/2 and EB in order to calculate the path metrics for the tail biting states in the second and third sets.

Figure 4:
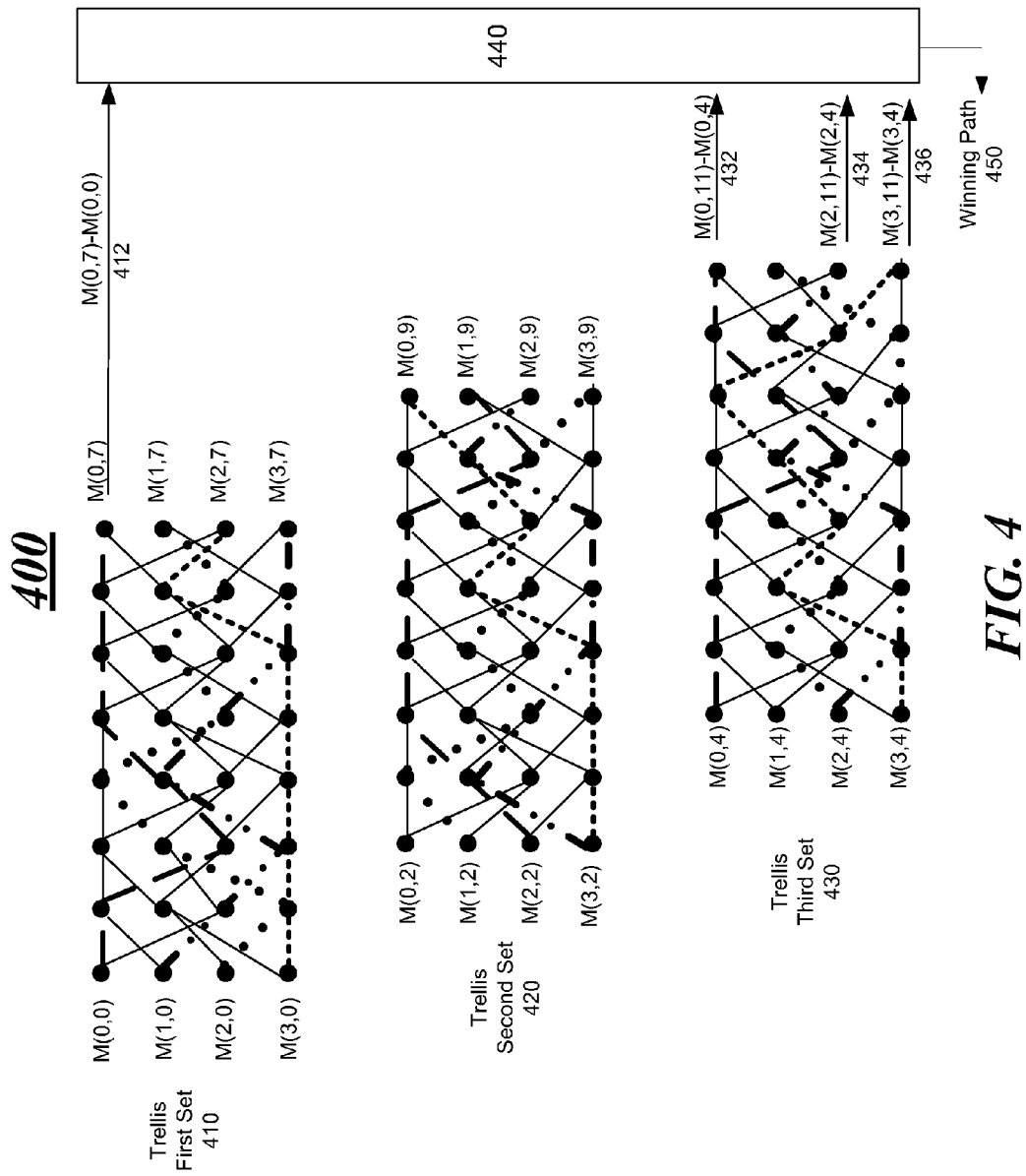
FIG. 4 illustrates an embodiment of a trellis with the beginning and ending states.

FIG. 4 illustrates an embodiment of a trellis with the beginning and ending states. FIG. 4 depicts a trellis 400 divided into three sets 410, 420 and 430. As shown in FIG. 4, N may equal eight. Each set 410, 420 and 430 may include eight stages. The first set 410 has stage 0 through stage 7. FIG. 4 depicts four states. In FIG. 4, extra bits EB equals four, so the second set may 420 begin at stage 2 and the third set 430 may begin at stage 4

In an embodiment, path metrics may be determined for each state in a given set. It may be determined which states are tail biting, e.g., which states begin and end at the same state. In an embodiment, the root state vectors for each of the sets may determine a first or root state corresponding to the last or second state. In an embodiment, the decoder 146 may update the root state vectors or N-path metrics for each state s. At the end of a set, each vector may determine which states are tail biting states. A vector may identify a tail biting state when the first or root state is the same as the second or last state of a set. The N-path metrics, or relative metrics, may be recorded for a path where the state of the first stage and the state of the last state in the set are equal. In an embodiment, the N-path metric of a given state may be the difference between the state's metric in the last stage and the state's metric in the first stage, e.g., N stages before.

In an embodiment, M(s,n) may represent an accumulated metric for stage n and state s. A first set 410 may be the zero set. For a first set 410, the N-path metrics may be Metric(s, N−1)-Metric (s,0). Looking to the first set 410 in FIG. 4, M (0,0) may have a first or root state of 0 and a second or last state of 0. M(1,0) may have a first state of state 1, but not have a second state of state 1. M (2,0) may have a first state of state 2, but not have a second state of state 2. M (3,0) may have a first state of state 3, but not have a second state of state 3. In the first set in FIG. 4, only state 0 may have a second state that is the same as the first state. In the first set, only state 0 may have a first or root state and a second or last state of 0. In other words, only set_0[s] may equal 0. State 0 may be the only tail biting convolutional code in the first set. As there is a single tail biting state in the first set, the only path metric for the first set 410 may be path metric 412 M (0,7)-M (0,0).

The decoder 146 may cycle the trellis 400 for another EB/2 steps and may record the N-path metrics at Metric (s, N+EB/2−1)-Metric (S, EB/2) of the second set 420. Looking to the second set 420, M (0,2) may have a first or root state of state 0, but not have a second or last state of state 0. M (1,2) may have a first state of state 1, but not have a second state of state 1. M (2,2) may have a first state of state 2, but not have a second state of state 2. M (3,2) may have a first state of state 3, but not have a second state of state 3. The decoder 146 may compare the first state to the second state 420 for all states in the second set 420 of the trellis. Looking at the second set 420 in FIG. 4, no states may have a first state and a second state in the same state. The second set may have no states that begin and end in the same state. As the second set 420 has no tail biting states, no path metrics may be determined.

The trellis 400 may cycle for another EB steps and may record the N-path metrics at Metric (S, EB)-Metric (S, N+EB−1) of the third set 430. Looking to the third set 430, M(0,4) may have a first or root state of state 0 and a second or last state of state 0. M(1,4) may have a first state of state 1, but not have a second state of state 1. M(2,4) may have a first state of state 2 and a second state of state 2. M(3,4) may have a first state of state 3 and a second state of state 3. The decoder 146 may compare the first state to the second state for all states in the third set 430 of the trellis 400. Looking at the third set 430 in FIG. 4, states 0, 2 and 3 all may have a second or last state that equals the first or root state. In other words, states 0, 2 and 3 all may have states that begin and end at the same state. Accordingly, path metric 432 M(0,11)-M(0,4) may be determined for state 0. Path metric 434 M(2,11)-M(2,4) may be determined for state 2. Path metric 436 M(3,11)-M(3,4) may be determined for state 3

Referring again to FIG. 2, the logic flow 200 may compare the path metrics to determine a state with a minimum path metric at block 206. In an embodiment, the best path metric of a tail biting state among the three sets 410, 420 and 430 may constitute a winner. In an embodiment, the best path metric may be the minimum path metric. A minimum path metric may be an optimal path from a beginning or first stage to a last or second stage. In an embodiment, the minimum path metric may be optimal among all the tail biting path metrics among all the sets 410, 420 and 430.

Referring again to FIG. 3, the decoder 146 may compare convolutional code sets, 310, 320 and 330 to determine a tail biting winner 340. In an embodiment, a decoder may compare path metrics for each tail biting state in the first set 310, second set 320 and third set 330 to determine a state with a minimum path metric 340.

Referring again to FIG. 4, the decoder 146 may compare 440 the path metrics: M(0,7)-M(0.0), M(0,11)-M(0,4), M(2, 11)-M(2,4), and M(3,11)-M(3,4). As each metric is a relative path metric as opposed to an absolute metric, the metrics may be compared 440. In other words, each metric may subtract the first or root state from the second or last state. Each metric may include the same number of stages N. The decoder 146 may compare the metrics of various sets 410, 420 and 430 to determine a winning path 450. In an embodiment, the winning path 450 may be the minimum path metric.

Referring again to FIG. 2, the logic flow 200 may output bits from the state of the minimum path metric at block 208. The embodiments are not limited to this example. In an embodiment, the bits may be output by tracing back from the state of the winning path. In an embodiment, the output bits may be traced back using the RootState_i[s] algorithm described above.

Figure 5:
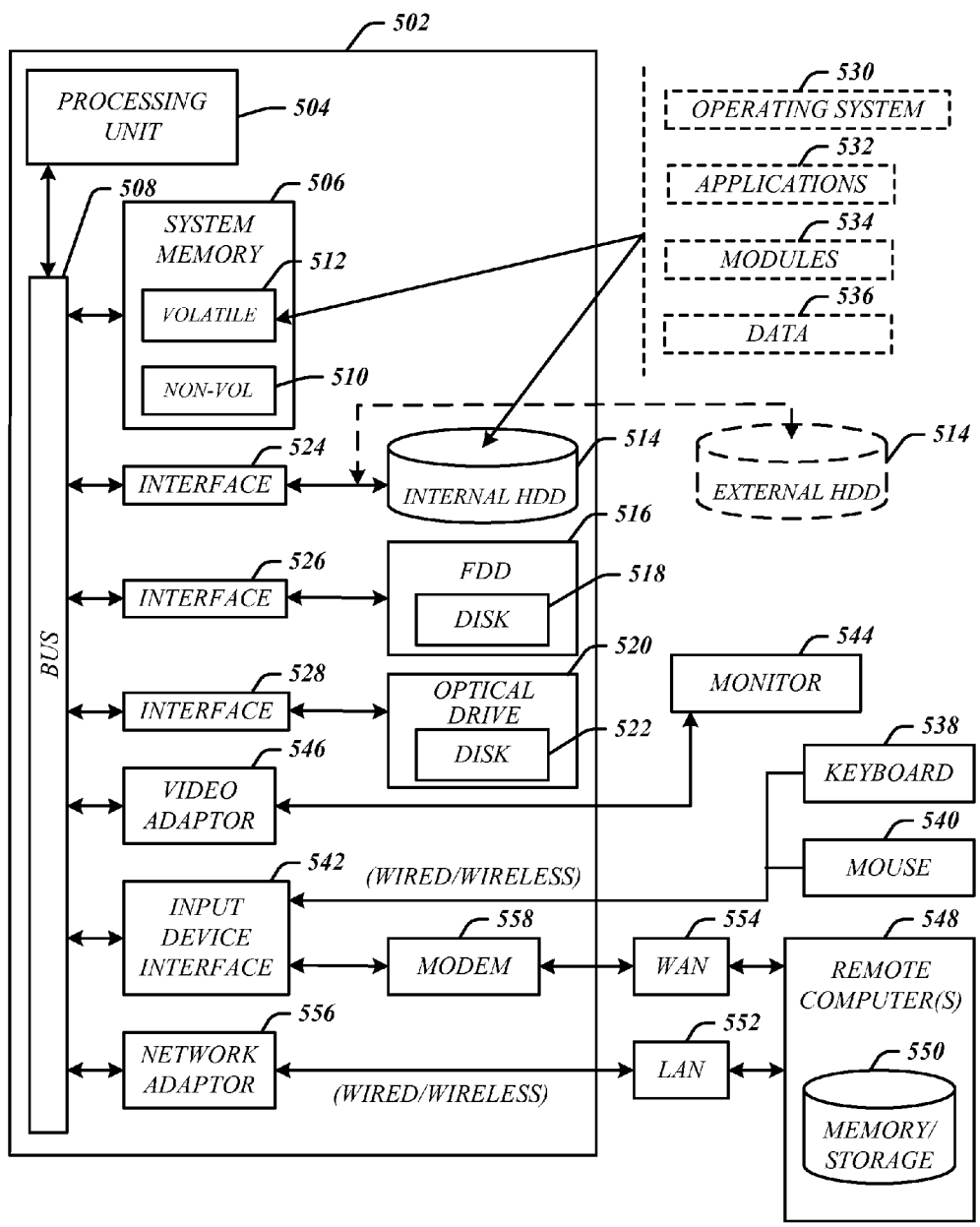
FIG. 5 illustrates an embodiment of a computing architecture.

FIG. 5 illustrates an embodiment of an exemplary computing architecture 500 suitable for implementing various embodiments as previously described. As used in this application, the terms "system" and "component" are intended to refer to a computer-related entity, either hardware, a combination of hardware and software, software, or software in execution, examples of which are provided by the exemplary computing architecture 500. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

In one embodiment, the computing architecture 500 may comprise or be implemented as part of an electronic device. Examples of an electronic device may include without limitation a mobile device, a personal digital assistant, a mobile computing device, a smart phone, a cellular telephone, a handset, a one-way pager, a two-way pager, a messaging device, a computer, a personal computer (PC), a desktop computer, a laptop computer, a notebook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, television, digital television, set top box, wireless access point, base station, subscriber station, mobile subscriber center, radio network controller, router, hub, gateway, bridge, switch, machine, or combination thereof. The embodiments are not limited in this context.

The computing architecture 500 includes various common computing elements, such as one or more processors, co-processors, memory units, chipsets, controllers, peripherals, interfaces, oscillators, timing devices, video cards, audio cards, multimedia input/output (I/O) components, and so forth. The embodiments, however, are not limited to implementation by the computing architecture 500.

As shown in FIG. 5, the computing architecture 500 comprises a processing unit 504, a system memory 506 and a system bus 508. The processing unit 504 can be any of various commercially available processors. Dual microprocessors and other multi-processor architectures may also be employed as the processing unit 504. The system bus 508 provides an interface for system components including, but not limited to, the system memory 506 to the processing unit 504. The system bus 508 can be any of several types of bus structure that may further interconnect to a memory bus (with or without a memory controller), a peripheral bus, and a local bus using any of a variety of commercially available bus architectures.

The computing architecture 500 may comprise or implement various articles of manufacture. An article of manufacture may comprise a computer-readable storage medium to store logic. Examples of a computer-readable storage medium may include any tangible media capable of storing electronic data, including volatile memory or non-volatile memory, removable or non-removable memory, erasable or non-erasable memory, writeable or re-writeable memory, and so forth. Examples of logic may include executable computer program instructions implemented using any suitable type of code, such as source code, compiled code, interpreted code, executable code, static code, dynamic code, object-oriented code, visual code, and the like.

The system memory 506 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. In the illustrated embodiment shown in FIG. 5, the system memory 506 can include non-volatile memory 510 and/or volatile memory 512. A basic input/output system (BIOS) can be stored in the non-volatile memory 510.

The computer 502 may include various types of computer-readable storage media in the form of one or more lower speed memory units, including an internal hard disk drive (HDD) 514, a magnetic floppy disk drive (FDD) 516 to read from or write to a removable magnetic disk 518, and an optical disk drive 520 to read from or write to a removable optical disk 522 (e.g., a CD-ROM or DVD). The HDD 514, FDD 516 and optical disk drive 520 can be connected to the system bus 508 by a HDD interface 524, an FDD interface 526 and an optical drive interface 528, respectively. The HDD interface 524 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 510, 512, including an operating system 530, one or more application programs 532, other program modules 534, and program data 536. The one or more application programs 532, other program modules 534, and program data 536 can include, for example, the decoder 146.

A user can enter commands and information into the computer 502 through one or more wire/wireless input devices, for example, a keyboard 538 and a pointing device, such as a mouse 540. Other input devices may include a microphone, an infra-red (IR) remote control, a joystick, a game pad, a stylus pen, touch screen, or the like. These and other input devices are often connected to the processing unit 504 through an input device interface 542 that is coupled to the system bus 508, but can be connected by other interfaces such as a parallel port, IEEE 1394 serial port, a game port, a USB port, an IR interface, and so forth.

A monitor 544 or other type of display device is also connected to the system bus 508 via an interface, such as a video adaptor 546. In addition to the monitor 544, a computer typically includes other peripheral output devices, such as speakers, printers, and so forth.

The computer 502 may operate in a networked environment using logical connections via wire and/or wireless communications to one or more remote computers, such as a remote computer 548. The remote computer 548 can be a workstation, a server computer, a router, a personal computer, portable computer, microprocessor-based entertainment appliance, a peer device or other common network device, and typically includes many or all of the elements described relative to the computer 502, although, for purposes of brevity, only a memory/storage device 550 is illustrated. The logical connections depicted include wire/wireless connectivity to a local area network (LAN) 552 and/or larger networks, for example, a wide area network (WAN) 554. Such LAN and WAN networking environments are commonplace in offices and companies, and facilitate enterprise-wide computer networks, such as intranets, all of which may connect to a global communications network, for example, the Internet.

When used in a LAN networking environment, the computer 502 is connected to the LAN 552 through a wire and/or wireless communication network interface or adaptor 556. The adaptor 556 can facilitate wire and/or wireless communications to the LAN 552, which may also include a wireless access point disposed thereon for communicating with the wireless functionality of the adaptor 556.

When used in a WAN networking environment, the computer 502 can include a modem 558, or is connected to a communications server on the WAN 554, or has other means for establishing communications over the WAN 554, such as by way of the Internet. The modem 558, which can be internal or external and a wire and/or wireless device, connects to the system bus 508 via the input device interface 542. In a networked environment, program modules depicted relative to the computer 502, or portions thereof, can be stored in the remote memory/storage device 550. It will be appreciated that the network connections shown are exemplary and other means of establishing a communications link between the computers can be used.

The computer 502 is operable to communicate with wire and wireless devices or entities using the IEEE 802 family of standards, such as wireless devices operatively disposed in wireless communication (e.g., IEEE 802.11 over-the-air modulation techniques) with, for example, a printer, scanner, desktop and/or portable computer, personal digital assistant (PDA), communications satellite, any piece of equipment or location associated with a wirelessly detectable tag (e.g., a kiosk, news stand, restroom), and telephone. This includes at least Wi-Fi (or Wireless Fidelity), WiMax, and Bluetooth™ wireless technologies. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

The invention claimed is:

1. A method performed by a wireless transceiver, comprising:
   receiving a message via a receiver;
   decoding the message via a decoder by:
      determining a plurality of overlapping sets of a trellis diagram for a convolutional code in the message, each set comprising a first stage and a second stage of the trellis diagram and comprising a plurality of states;
      determining a plurality of tail-biting states, each tail-biting state comprising one of the plurality of states of one of the plurality of overlapping sets;
      determining path metrics for each of the plurality of tail-biting states;
      comparing the path metrics to determine a tail-biting state with a minimum path metric; and
      outputting bits from the tail-biting state with the minimum path metric.

2. The method of claim 1, comprising:
   determining for a first set whether the first stage and the second stage have a same state, wherein the second stage of the first set is N stages from the first stage of the first set; and
   determining for a second set whether the first stage and the second stage have a same state, wherein the second stage of the second set is N stages from the first stage of the second set and the first stage of the second set is located between the first stage of the first set and the second stage of the first set.

3. The method of claim 1, each set having a same number of stages.

4. The method of claim 1, determining the plurality of sets comprising:

determining a first set comprising a stage 0 through a stage N of the trellis diagram, where N is a length of the message;

determining a second set comprising a stage EB/2 through a stage N+EB/2 of the trellis diagram, where EB is a number of extra bits of the trellis diagram; and determining a third set comprising a stage EB through a stage N+EB of the trellis diagram.

5. The method of claim 4, wherein the trellis diagram comprises N+EB+1 stages.

6. The method of claim 1, wherein each path metric is a difference between a tail-biting state's metric in the second stage of its set and the tail-biting state's metric in the first stage of its set.

7. The method of claim 1, outputting bits from the tail-biting state with the minimum path metric comprising outputting bits by tracing back from the tail biting state with the minimum path metric.

8. The method of claim 1 wherein the plurality of sets of the trellis diagram comprises three or more sets.

9. An article comprising a storage medium containing instructions that when executed enable a system to:

determine, via a decoder for a receiver, a plurality of overlapping sets of a trellis diagram for a convolutional code in a message, each set comprising a first stage and a second stage of the trellis diagram and comprising a plurality of states;

determine a plurality of tail-biting states, each tail-biting state comprising one of the plurality of states of one of the plurality of overlapping sets;

determine path metrics for each of the plurality of tail-biting states;

compare, via the decoder, the path metrics to determine a tail-biting state with a minimum path metric; and output bits by tracing back from the tail-biting state with the minimum path metric.

10. The article of claim 9, comprising instructions that when executed enable the system to:

determine a first set comprising a stage 0 through a stage N of the trellis diagram, where N is a length of the message;

determine a second set comprising a stage EB/2 through a stage N+EB/2 of the trellis diagram, where EB is a number of extra bits of the trellis diagram; and determine a third set comprising a stage EB through a stage N+EB of the trellis diagram.

11. The article of claim 9 wherein each set overlaps with at least one other set.

12. The article of claim 9 comprising instructions that when executed enable the system to determine the plurality of overlapping sets via circular processing.

13. An apparatus, comprising:

a processor; and a receiver to receive a message, the receiver having a decoder that when executed by the processor is operative to determine multiple overlapping sets of a trellis diagram for a convolutional code in the message, each set having a different first stage and second stage and comprising a plurality of states, determine a plurality of tail-biting states, each tail-biting state comprising one of the plurality of states of one of the plurality of overlapping sets, determine path metrics for each of the plurality of tail-biting states, determine a tail-biting state with a minimum path metric, and output bits from the tail-biting state of with the minimum path metric.

14. The apparatus of claim 13, each set overlapping with at least one other set.

15. The apparatus of claim 13, the decoder operative to:

determine a first set comprising a stage 0 through a stage N of the trellis diagram, where N is a length of the message, determine a second set comprising a stage EB/2 through a stage N+EB/2 of the trellis diagram, where EB is a number of extra bits of the trellis diagram, and determine a third set comprising a stage EB through a stage N+EB of the trellis diagram.

16. The apparatus of claim 15, where N is less than or equal to 100.

17. The apparatus of claim 13, comprising a digital display.

18. The apparatus of claim 13, the decoder to output the bits from the tail-biting state with the minimum path metric by tracing back from the tail-biting state with the minimum path metric.

* * * * *